United States Patent
Strickland

[11] Patent Number: 5,888,102
[45] Date of Patent: Mar. 30, 1999

[54] SURFACE MOUNT CARRIER FOR ELECTRONIC COMPONENTS

[76] Inventor: John Strickland, 8641 Glenoaks Blvd., #111, Sun Valley, Calif. 91352

[21] Appl. No.: 907,378

[22] Filed: Aug. 7, 1997

Related U.S. Application Data

[60] Provisional application No. 60/031,998 Nov. 25, 1996.

[51] Int. Cl.[6] ............................................. H01R 33/00
[52] U.S. Cl. .................................... 439/698; 361/809
[58] Field of Search ................................ 439/698, 931, 439/68, 72; 361/767, 807, 805, 809, 820

[56] References Cited

U.S. PATENT DOCUMENTS

| | | | |
|---|---|---|---|
| 2,907,924 | 10/1959 | Lutton | 361/729 |
| 3,107,319 | 10/1963 | Vizzier | 361/767 |
| 3,114,080 | 12/1963 | Koda et al. | 361/762 |
| 3,154,281 | 10/1964 | Frank | 248/201 |
| 3,271,507 | 9/1966 | Elliott | 174/52.2 |
| 3,302,143 | 1/1967 | Harkenrider | 335/154 |
| 4,395,585 | 7/1983 | Polcyn | 174/138 G |
| 4,405,480 | 9/1983 | Murase et al. | 252/62.3 BT |
| 4,631,639 | 12/1986 | Biraud | 361/807 |
| 4,869,202 | 9/1989 | Baker | 118/425 |
| 5,037,309 | 8/1991 | Abe et al. | 439/56 |
| 5,128,834 | 7/1992 | Kaschke | 361/807 |
| 5,147,209 | 9/1992 | Litwin et al. | 439/70 |
| 5,170,323 | 12/1992 | Perretta et al. | 361/704 |
| 5,440,452 | 8/1995 | Kitahara | 361/773 |

*Primary Examiner*—Steven L. Stephan
*Assistant Examiner*—T C Patel
*Attorney, Agent, or Firm*—Mills Law Firm PLLC; Clifford F. Rey

[57] ABSTRACT

A surface mount carrier device which permits an electrical component having wire leads to be converted for surface mounting on a printed circuit board is disclosed. The carrier device comprises a body member fabricated from an electrical insulating material which includes a pair of upwardly extending, U-shaped lead supports. The lead supports define a pair of vertically opposed, symmetrical notches wherein the wire leads of the component are attached to the carrier device. In one embodiment the carrier device includes a pair of electrically conductive tabs which are secured within the notches and bent around the end faces of the carrier device and extend to a bottom surface thereof so as to provide an electrical pathway from the component to the printed circuit board whereon it will be fused. The wire leads are soldered to the conductive tabs and cut off at the end faces of the carrier device. In an alternative embodiment the conductive tabs are omitted from the carrier device in lieu of a groove formed along the longitudinal center line of the notches and extending around the end faces of the carrier to a bottom surface thereof. In this arrangement the wire leads are bent at right angles around the end faces of the carrier so as to be disposed within the groove extending to the bottom surface of the carrier to place the leads in contact with the printed circuit board. The carrier devices are provided in a range of sizes to accommodate electrical components of various configurations.

5 Claims, 2 Drawing Sheets

SURFACE MOUNT CARRIER FOR ELECTRONIC COMPONENTS

CLAIM OF BENEFIT OF PROVISIONAL APPLICATION

This Application claims the benefit under 35 U.S.C. 119(e) of United States Provisional application Ser. No. 60/031,998 filed Nov. 25, 1996 by John Strickland for Surface Mount Carrier for Electronic Components.

BACKGROUND OF INVENTION

Field of Invention

The present invention relates to electronic components and, more particularly, to a carrier device which permits an electrical component having wire leads to be converted for surface mounting on a printed circuit board.

Electrical components having wire leads for mechanical or solderable connection to terminals within an electrical circuit are well known to those skilled in the art. For example, the resistor is a familiar electrical component wherein a metallic material having a specific resistance is molded within a generally cylindrical body formed of insulating material including a pair of conductive wire leads extending from either end thereof.

The wire leads are adapted for mechanical attachment to terminals within a particular circuit which are electrically connected by conductive wiring to other components in the circuit.

Such electrical terminals often include an aperture or hole wherein a terminal end of the wire lead may be inserted and mechanically attached in a so-called through-hole connection in preparation for soldering.

Modernly, printed circuit boards are utilized in a wide variety of electronic appliances. In such printed circuit boards, the electrical pathways between components are formed within the board and filled with a metallic alloy forming an electrically conductive network upon the surface of the circuit board. Thereafter, the required surface mounted components are soldered to the surface of the printed circuit board to complete the electrical circuits.

In order to utilize a conventional electrical component such a resistor having wire leads on a printed circuit board, it is necessary to attach mechanical terminals to the board and, thereafter, solder the leaded component thereto. This process is tedious, labor intensive, and results in increased manufacturing costs.

Thus, the present invention has been developed to conveniently adapt conventional electrical components having wire leads for mounting on the surface of a printed circuit board.

DESCRIPTION OF RELATED PRIOR ART

U.S. Pat. No. 5,128,834 to Kevin D. Kaschke discloses a surface mount receptacle for leaded components having a receptacle attached to the component which renders the resultant assembly capable of mounting to the top of a substrate. The receptacle captures the component in a secure position and provides a specific orientation until the leads are coupled to the substrate. However, the receptacle is not conductive in the manner of the present invention.

U.S. Pat. No. 4,395,585 to Erwin R. Polcyn discloses a multiple use component spacer and method for preparing a spacer for mounting on a circuit board. The spacer includes a component platform defining an aperture having a plurality of lead grasping portions each having forked resilient portions defining a lead receiving slot for firm engagement of the leads with a range of electronic components without requiring the use of adhesives.

U.S. Pat. No. 3,107,319 to Benton A. Vizzier discloses a modular component printed circuit connector whereon a plurality of leaded wire components may be soldered for attachment to a printed circuit board. The modular connector is attached to the circuit board by mechanical fasteners such as machine screws.

U.S. Pat. No. 5,037,309 to Youji Abe et al. discloses a holder for installing parts such as a light emitting diode on a printed circuit board, the printed circuit board having a connecting section and a pair of conduction terminals, the connecting section serving to mechanically connect the holder to the printed circuit board, the conduction terminals serving to electrically connect a pair of terminals of the part to the printed circuit board.

U.S. Pat. No. 3,271,507 to Charles G. Elliott discloses a flat package for semi-conductor on which small semi-conductor elements are mounted, and, more particularly, the invention relates to semi-conductor packages in which all circuit connections to terminals are enclosed within the package, with only the terminals exposed. The package of the invention is preferably mounted terminal-side down, i.e. inverted, on a circuit board with the terminals in direct contact with the other circuit elements or conductors.

U.S. Pat. No. 3,302,143 to Robert J. Harkenrider discloses a reed relay assembly having improved mounting means which serves to increase the efficiency of the relay assembly and also acts as a unique terminal clip for physically and electrically connecting the relay assembly to a printed circuit board.

U.S. Pat. No. 3,114,080 to Arthur J. Koda et al. discloses a switching assembly including resilient switch mounting means for supporting a terminal of a sealed switch unit within an opening in a dielectric panel, one portion of the supporting means being secured to the surface of the printed circuit panel and the other portion being secured to the terminal within the opening within the panel.

U.S. Pat. No. 5,170,323 to Frederick A. Peretta et al. discloses an electrical component clamping and thermal transfer device which rigidly supports the component and its connecting leads in a control panel so that they vibrate in unison in response to oscillations of the panel structure thereby preventing embrittlement and failure of the component leads.

U.S. Pat. No. 3,154,281 to Charles Frank discloses a holder for electronic components comprising a generally C-shaped fitting having a deformable plug molded thereto which is adapted to be inserted into a hole formed in a printed circuit board.

U.S. Pat. No. 5,147,209 to Stanley M. Litwin et al. discloses an intermediary adapter-connector which is interposed between a device having a pattern of pins projecting therefrom and a printed circuit board having contacts connected to various components. The body of the adapter is made of plateable dielectric material and is formed with holes corresponding to the pattern of pins of the device and also along one or more edges with pads corresponding in number to the holes. The pins of the device fit into the holes of the body and the plated pads on the body are soldered to contacts on the printed circuit board.

U.S. Pat. No. 5,440,452 to Akira Kitahara discloses a surface mount component comprising an IC chip and a plurality of leads extending outwardly from the body of the chip. The leads are interconnected by an insulating frame at their outer ends. Each of the leads is provided in the vicinity of the portion there adjoined to the frame within an outer lead portion to be electrically connected to a wiring board.

Finally, U.S. Pat. No. 4,869,202 to Jess J. Baker is considered of general interest in that it discloses an improved fixture for use in supporting a plurality of components, particularly such as electrical components having elongated conductive terminals, during solder dip process steps or the like.

SUMMARY OF THE INVENTION

After much research and study of the above mentioned problem, the present invention has been developed to provide an apparatus and method for utilizing an electrical component having wire leads intended for mechanical or solderable connection to a terminal to a component suitable for surface mounting on a printed circuit board.

This is accomplished by providing a carrier device which is configured to receive the electrical component such as a resistor therein so as to position the component in an electrically conductive relation to a printed circuit board.

The carrier device is formed essentially of an electrical insulating material. In one embodiment, the carrier device includes electrical pathways integrated thereon which place the wire leads of the component in contact with a printed circuit board. In an alternative embodiment the carrier device is fabricated entirely of an insulating material and the wire leads of the component are bent and secured to the carrier device placing the component in electrical connection with the printed circuit board when mounted thereon.

In view of the above, it is an object of the present invention to provide a carrier device that. permits an electrical component having wire leads to be converted for surface mounting applications on a printed circuit board.

Another object of the present invention is to provide a carrier device for an electrical component which is adapted to receive the component in solderable relation thereon for attachment to a printed circuit board.

Another object of the present invention is to provide a carrier device which is adapted to receive an electrical component thereon without soldering so as to place the wire leads in electrical connection with a printed circuit board.

Another object of the present invention is to provide a method of converting a conventional electrical component having wire leads such as a resistor that is intended for mechanical attachment to terminals to a component suitable for surface mounted application on a printed circuit board.

Other objects and advantages of the present invention will become apparent and obvious from a study of the following description and the accompanying drawings which are merely illustrative of such invention.

DRAWINGS

DETAILED DESCRIPTION OF THE PREFERRED EMBODIMENT

Figure 1:
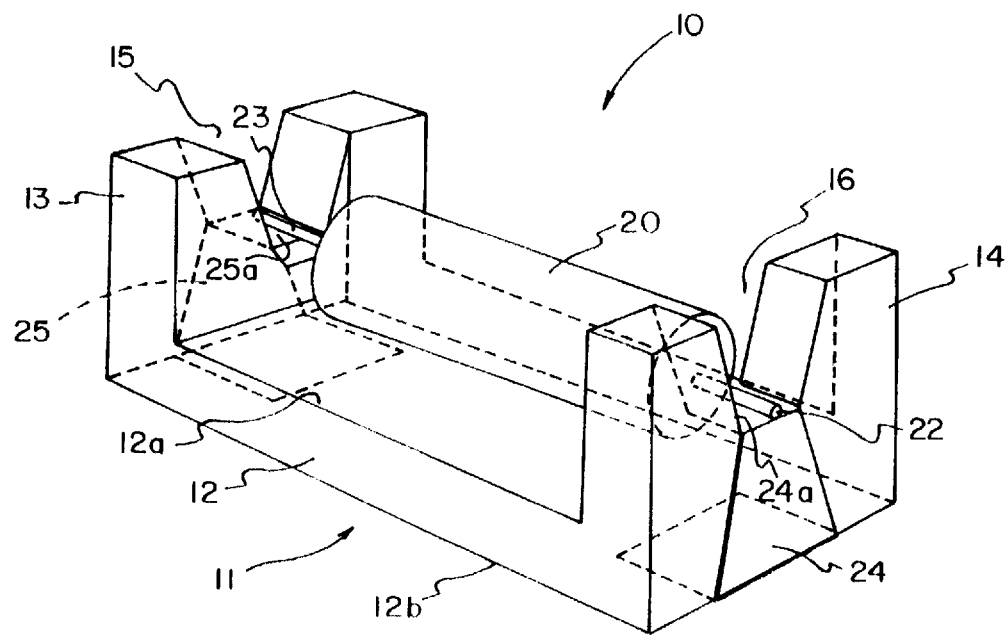
FIG. 1 is a perspective view of an embodiment of the surface mount carrier device of the present invention adapted for solderable attachment to an electrical component having wire leads.

With further reference to the drawings there is shown therein a surface mount carrier in accordance with the present invention illustrated in FIG. 1 and indicated generally at 10. The surface mount carrier 10 is shown installed in its functional position with a standard resistor, 20 having a pair of wire leads 22 and 24 extending therefrom, attached thereto.

In the preferred embodiment the carrier 10 includes a generally rectangular base 12 having a pair of vertically opposed lead supports 13 and 14 integrally formed therewith in perpendicular relation thereto.

Lead supports 13 and 14 are generally U-shaped in configuration defining a pair of centrally disposed notches 15 and 16 formed therein and being adapted to receive wire leads 22 and 23 respectively as described hereinafter in further detail.

In the preferred embodiment the base 12 together with lead supports 13 and 14 are of unitary construction and fabricated from a synthetic insulating material sold under the trade name Ryton, Valox, Noryl, Rynite, Polycarbonate or other suitable insulating material.

The carrier body 11 including the base 12 and lead supports 13 and 14 are formed by an injection molding process. Since such injection molding processes are well known to those skilled in the art, further detailed discussion of the same is not deemed necessary.

Figure 2:
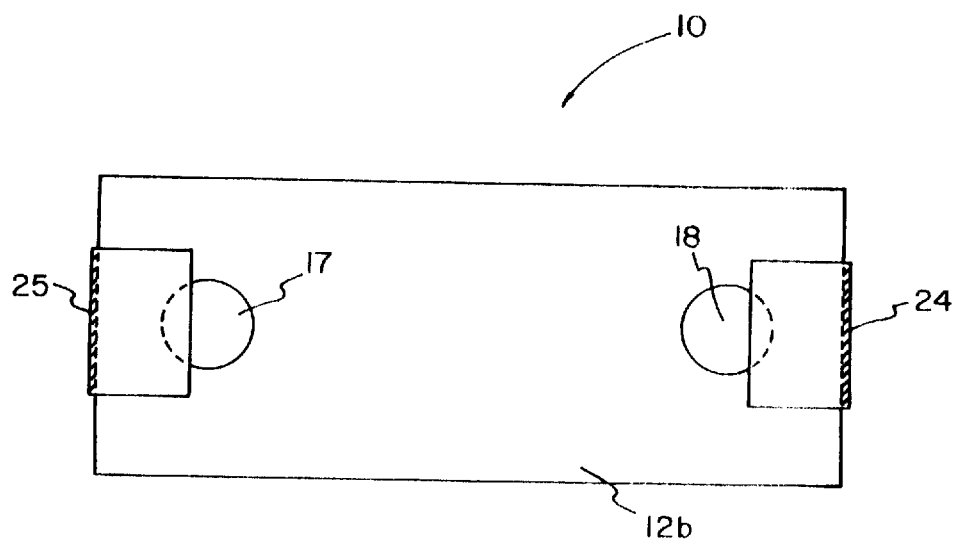
FIG. 2 is a bottom plan view of the surface mount carrier of FIG. 1 showing the attachment of the solderable tabs thereon.

A bottom surface 12b of base 12 includes a pair of recesses 17 and 18 formed therein and disposed along the longitudinal axis thereof in alignment with notches 15 and 16 as shown in FIG. 2.

In the preferred embodiment recesses 17 and 18 are cylindrical in configuration extending to a predetermined depth into base 12 and opening to the bottom surface 12b in perpendicular relation thereto.

Recesses 17 and 18 function to anchor the conductive tabs 24 and 25 as described hereinafter.

Figure 3:
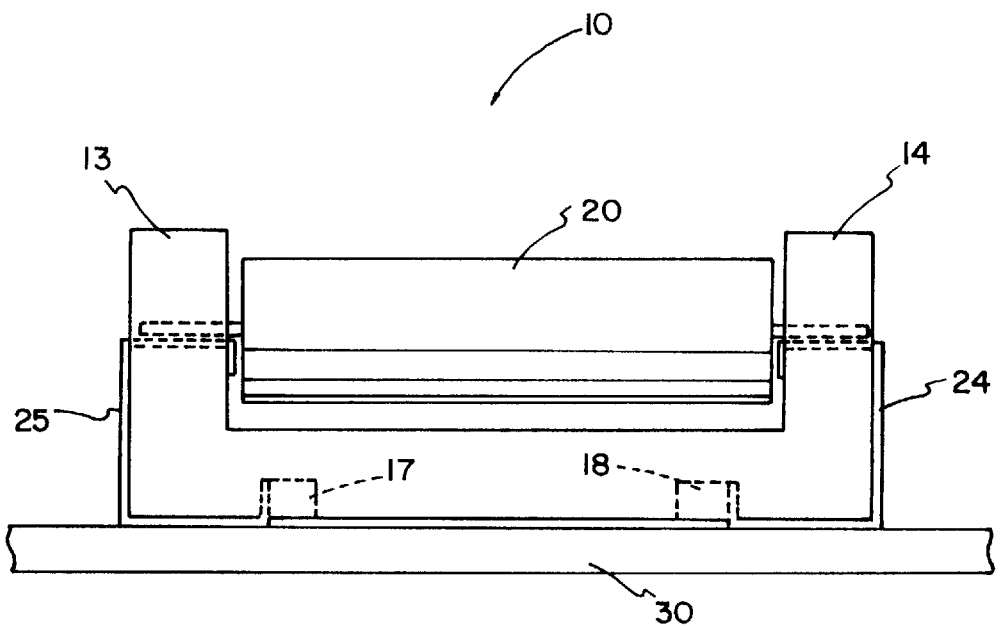
FIG. 3 is a side elevational view of the surface mount carrier showing the details of the construction thereof.
Figure 4:
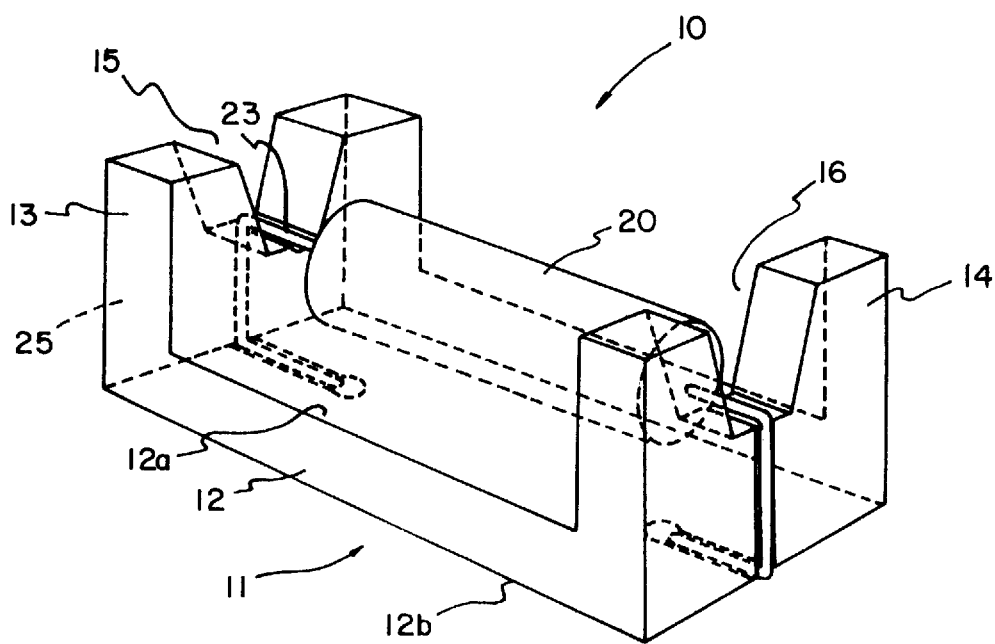
FIG. 4 is a perspective view of an alternative embodiment of the surface mount carrier of the present invention.

Carrier 10 includes a pair of conductive tabs 24 and 25 which are configured and dimensioned to closely fit and effectively wrap around the lower, outside comers of the carrier body 11 as shown in FIG. 3.

In the preferred embodiment tabs 24 and 25 are fabricated from a generally rectangular strip of copper sheet which is easily bent to the desired shape. The copper sheet may be tinned or coated with another suitable metallic alloy such as solder to provide an optimum surface for high temperature soldering or welding of wire leads 22 and 23 thereto.

Since such tinned copper material is well known to those skilled in the art, further detailed discussion of the same is not deemed necessary.

The proximal ends of tabs 24 and 25 are staked within the corresponding recesses 17 and 18 and secured therein using a conventional staking method.

Since such staking methods are well known to those skilled in the art, further detailed discussion of the same is not deemed necessary.

Thereafter, the tabs 24 and 25 are bent around the lower outside corners of the carrier body 11 conforming closely thereto. The terminal ends of tabs 24 and 25 are bent again to closely conform to the respective notches 15 and 16 using known techniques to secure the same in their functional position on the carrier body 11 as shown in FIG. 3.

In practical use the completed carrier 10 is now adapted to receive a conventional electronic component such as resistor 20 having wire leads 22 and 23 projecting therefrom.

Initially, a carrier 10 of appropriate dimensions is selected for mounting a conventional resistor 20 or other standard component having either axial or radial leads 22 and 23 extending therefrom.

Of course, carriers 10 will be provided in a variety of sizes and configurations to accommodate various standard components.

Next, the resistor 20 or other component is disposed on the carrier 10 such that the leads 22 and 23 are placed in contact with the terminal ends 24a and 25a of tabs 24 and 25 as shown in FIG. 1.

Next, the leads 22 and 23 are soldered or welded, as appropriate, to the respective tabs 24 and 25 to provide electrical continuity therebetween.

Thereafter, the terminal ends of leads 22 and 23 extending beyond the lead supports 13 and 14 are cut off and discarded.

At this point the conversion is complete and the originally leaded resistor 20 is adapted for surface mounting to a printed circuit board.

The carrier 10 with the resistor 20 installed therein may now be disposed on the surface of a printed circuit board 30 as shown in FIG. 3. In this arrangement the printed circuit board together with any number of surface mount carriers 10 may be processed in a soldering oven at a predetermined temperature to fuse the same to the printed circuit board 30 according to a known method.

In an alternative embodiment of the carrier device the conductive tabs 24 and 25 are omitted from the body 11 and a wire lead groove 27 is formed along the longitudinal center line of the respective notches 15 and 16 to a predetermined depth. The groove 27 extends around the outer periphery of the lead supports 13 and 14, continuing along the bottom surface 12d of the base portion of the carrier and terminating in the respective recesses 17 and 18.

It will be appreciated by those skilled in the are that the wire lead grooves 27 are semi-circular in cross-section so as to closely approximate the cross-sectional diameter of the wire leads 22 and 23 respectively. In this arrangement, the wire leads are simply bent at right angles so as to wrap around the respective end faces of the supports 13 and 14, continuing along the underside 12b of the body 11 and terminating in recesses 17 and 18 respectively.

In this embodiment the terminal ends of the respective wire leads 22 and 23 may be staked within the recesses 17 and 18 or attached therein by other known techniques.

Thus, the wire leads 22 and 23 are disposed in functional relation to the electrical pathways of a printed circuit board and may be attached thereto by processing in a soldering oven as described hereinabove.

From the above it can be seen that the surface mount carrier of the present invention provides a simple yet efficient method of adapting conventional electronic components having wire leads for surface mounting to a printed circuit board.

The terms "upper", "lower", "side", and so forth have been used herein merely for convenience to describe the present invention and its parts as oriented in the drawings. It is to be understood, however, that these terms are in no way limiting to the invention since such invention may obviously be disposed in different orientations when in use.

The present invention may, of course, be carried out in other specific ways than those herein set forth without departing from the spirit and essential characteristics of such invention. The present embodiments are, therefore, to be considered in all respects as illustrative and not restrictive, and all changes coming within the meaning and equivalency range of the appended claims are intended to be embraced therein.

What is claimed is:

1. A surface mount carrier device for adapting an electrical component having a plurality of wire leads such as a resistor for attachment to a printed circuit board comprising:

supporting means fabricated from an electrical insulating material and being adapted to receive said component in functional relation thereto, said supporting means including an elongated base member having a pair of vertically opposed lead engaging means being integrally formed therewith and extending upwardly therefrom in generally perpendicular relation thereto, said lead engaging means being generally U-shaped in configuration defining a pair of symmetrical notches therein for engaging said wire leads; and connecting means for attaching said wire leads in electrical connection with said printed circuit board, said connecting means including a groove formed in a surface of said lead engaging means along a longitudinal center line of said notches and extending around both end faces of said lead engaging means and continuing along a bottom surface of said base member terminating in a recess formed therein, said wire leads being bent at right angles conforming to said groove to position said wire leads on said carrier device without soldering thereby adapting said electrical component for installation directly onto said printed circuit board.

2. The carrier device of claim 1 wherein said connecting means includes a pair of conducting tab means disposed within said supporting body means, said tab means being adapted for electrical connection to said wire leads.

3. The carrier device of claim 2 wherein said tab means is fabricated from copper sheet material.

4. The carrier device of claim 3 wherein said copper sheet material is coated with a metallic alloy such as solder.

5. The carrier device of claim 1 wherein said groove is semicircular in cross-section and closely conforms to the cross-sectional diameter of said wire leads.

* * * * *